United States Patent
Buchanan et al.

(10) Patent No.: US 7,887,711 B2
(45) Date of Patent: Feb. 15, 2011

(54) METHOD FOR ETCHING CHEMICALLY INERT METAL OXIDES

(75) Inventors: Douglas A. Buchanan, Cortlandt Manor, NY (US); Eduard A. Cartier, Leuven (BE); Evgeni Gousev, Mahopac, NY (US); Harald Okorn-Schmidt, Putnam Valley, NY (US); Katherine L. Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 10/170,914

(22) Filed: Jun. 13, 2002

(65) Prior Publication Data

US 2003/0230549 A1 Dec. 18, 2003

(51) Int. Cl.
*B44C 1/22* (2006.01)
*H01L 21/00* (2006.01)

(52) U.S. Cl. .............................. 216/62; 216/41; 216/63; 216/67; 216/69; 216/74; 438/723; 438/924

(58) Field of Classification Search ................... 216/41, 216/62, 66, 67, 79, 69, 74; 438/723, 924
See application file for complete search history.

(56) References Cited

U.S. PATENT DOCUMENTS

| 4,104,085 | A | * | 8/1978 | Zandveld | 438/527 |
| 4,213,818 | A | * | 7/1980 | Lemons et al. | 438/719 |
| 4,652,334 | A | | 3/1987 | Jain et al. | |
| 4,808,259 | A | * | 2/1989 | Jillie et al. | 438/593 |
| 5,356,870 | A | * | 10/1994 | Fujiwara et al. | 505/329 |

(Continued)

FOREIGN PATENT DOCUMENTS

JP    403093141  A  *  4/1991

OTHER PUBLICATIONS

Wolf et al "Silicon Processing for The VLSI Era" 1986, p. 541.*

(Continued)

*Primary Examiner*—Shamim Ahmed
(74) *Attorney, Agent, or Firm*—Scully, Scott, Murphy & Presser, P.C.; Louis J. Percello, Esq.

(57) ABSTRACT

A system and method for patterning metal oxide materials in a semiconductor structure. The method comprises a first step of depositing a layer of metal oxide material over a substrate. Then, a patterned mask layer is formed over the metal oxide layer leaving one or more first regions of the metal oxide layer exposed. The exposed first regions of the metal oxide layer are then subjected to an energetic particle bombardment process to thereby damage the first regions of the metal oxide layer. The exposed and damaged first regions of the metal oxide layer are then removed by a chemical etch. Advantageously, the system and method is implemented to provide high-k dielectric materials in small-scale semiconductor devices. Besides using the ion implantation damage (I/I damage) plus wet etch technique to metal oxides (including metal oxides not previously etchable by wet methods), other damage methods including lower energy, plasma-based ion bombardment, may be implemented. Plasma-based ion bombardment typically uses simpler and cheaper tooling, and results in less collateral damage to underlying structures as the damage profile can be more easily localized to the depth of the thin metal oxide film.

19 Claims, 9 Drawing Sheets

U.S. PATENT DOCUMENTS

| | | | | |
|---|---|---|---|---|
| 5,413,953 | A | * | 5/1995 | Chien et al. ................. 438/443 |
| 5,968,377 | A | * | 10/1999 | Yuasa et al. ............ 219/121.41 |
| 5,976,328 | A | * | 11/1999 | Azuma et al. .......... 204/192.34 |
| 6,117,739 | A | * | 9/2000 | Gardner et al. .............. 438/289 |
| 6,297,107 | B1 | * | 10/2001 | Paton et al. ................. 438/291 |
| 6,300,202 | B1 | * | 10/2001 | Hobbs et al. ................ 438/287 |
| 6,300,756 | B2 | * | 10/2001 | Sturm et al. ................ 324/109 |
| 6,331,492 | B2 | * | 12/2001 | Misium et al. .............. 438/762 |
| 6,365,525 | B2 | * | 4/2002 | Muller ....................... 438/705 |
| 6,383,873 | B1 | * | 5/2002 | Hegde et al. ................ 438/287 |
| 6,475,842 | B1 | * | 11/2002 | Cheah et al. ................ 438/197 |
| 6,667,246 | B2 | | 12/2003 | Mitsuhashi et al. ......... 438/756 |
| 6,764,898 | B1 | * | 7/2004 | En et al. ..................... 438/240 |
| 2001/0012570 | A1 | * | 8/2001 | Egitto et al. ................ 428/643 |
| 2001/0037994 | A1 | * | 11/2001 | Ezaki ......................... 216/62 |
| 2002/0046705 | A1 | * | 4/2002 | Sandhu et al. .............. 118/719 |
| 2003/0015497 | A1 | * | 1/2003 | Gill et al. ..................... 216/83 |
| 2003/0096484 | A1 | * | 5/2003 | Lee et al. .................... 438/305 |
| 2004/0137831 | A1 | * | 7/2004 | Kollodge et al. .............. 451/41 |

OTHER PUBLICATIONS

HF Wet Etching of Oxide After Ion Implantation, Lianjun Liu, KL Pey, Pangdow Foo, Institute of Microelectronics.

Characterization of Bulk and Interface Properties of DiElectric Layers and Stacks, H.F. Okorn-Schmidt, et al., The Physics and Chemistry of SiO2 and the SiO2 Interface 4, Proc. vol. 2000-2, The Electrochemical Society, Pennington, NJ, 2000.

Characterization of Silicon Surface Preparation Processes for Advanced Gate DiElectrics, H.F. Okorn-Schmidt, IBM J. Res. Develop. vol. 43, No. 3, May 1999.

* cited by examiner

METHOD FOR ETCHING CHEMICALLY INERT METAL OXIDES

FIELD OF THE INVENTION

This invention generally relates to the wet chemical etching of metal oxides. More particularly, it relates to the patterning of chemically inert and/or high temperature-treated metal oxides for applications such as high-k gate dielectrics in memory and logic devices, tunnel oxides, passivation layers, nano-devices, thin film capacitors, etc.

BACKGROUND OF THE INVENTION

Metal oxides of Zr, Hf, La, Y and Al are being investigated as possible candidates to replace $SiO_2$ as a gate dielectric in complementary metal-oxide-semiconductor (CMOS) devices, in part because the higher dielectric constant, k, of these oxides allows the dielectric thickness to be scaled to below 1 nm EOT (equivalent oxide thickness). With current process practices, the gate dielectric is deposited at an early stage of processing and is subsequently subjected to thermal treatments at temperatures of 1000° C. or higher, depending on application and device type.

Metal oxides such as $Al_2O_3$ can undergo phase modifications during these thermal treatments that render the material impossible to etch in commonly used wet chemical etching mixtures such as aqueous HF (hydrofluoric acid). However, these metal oxides must be etched if electrical contact is to be made to underlying layers, for example to the source and drain areas of field effect transistor (FET) devices in CMOS circuits. While reactive ion etching (RIE) is a possible alternative to wet chemical etching, it is not preferred in these critical processes due to the danger of overetching into underlying device layers.

Thicker (10-100 nm) high-k metal oxides are also being investigated as possible candidates to replace $SiO_2$ as the capacitor dielectric in thin film metal-insulator-metal capacitors (MIMCAPs) to provide a higher capacitance density. In this case, contact openings to the bottom capacitor electrode are typically formed by etching the metal oxide using the pattern of the top electrode as a mask. Again, wet patterning would often be preferred to RIE due to concerns about overetching into the bottom electrode and redeposition of sputtered bottom electrode material (which may cause shorts between the bottom and top electrodes).

Ion implantation has long been known to increase the etch rate of $SiO_2$. This effect is discussed in a recent paper by L. Liu et al ("HF wet etching of oxide after ion implantation," Proceedings 1996 IEEE Hong Kong Electron Devices Meeting, Jun. 29, 1996), and has provided the basis for several patents on patterning $SiO_2$ (see for example, K. C. Jain et al., U.S. Pat. No. 4,652,334 issued Mar. 24, 1987 and entitled "Method for Patterning Silicon Dioxide with High Resolution in Three Dimensions"). However, this effect has not been previously exploited for the etching and patterning of chemically inert metal oxide films, a particularly important case, since so many of these films are impossible to etch without ion-induced damage.

It would thus be highly desirable to provide a system and method for patterning chemically inert and/or high temperature-treated metal oxide films in which selected areas of such films could be made to become susceptible to the conventional wet etch solutions.

SUMMARY OF THE INVENTION

It is an object of the present invention to provide a semiconductor device fabrication system and method for converting high temperature treated high-k metal oxides (gate dielectrics) into etchable materials.

It is a further object of the present invention to provide a system and method for patterning chemically inert and/or high temperature-treated metal oxide films in which selected areas of such films are converted into materials that can be etched with conventional wet etch solutions.

The present invention provides a semiconductor device fabrication system and method for patterning chemically inert and/or high temperature treated metal oxide films that would normally be impervious to conventional wet etch solutions such as aqueous HF. Etching is performed in these same conventional wet etch solutions after the metal oxide regions to be etched are modified, i.e., damaged, by ion (or other charged particle) bombardment processes such as ion implantation or plasma treatment, and/or a short Reactive Ion Etching (RIE) process. If preferred, damage may also be effected by energetic neutral particles, for example, by x-rays, or by photons from pulsed or continuous ultraviolet lasers.

According to the principles of the invention, there is provided a semiconductor device fabrication system and method for patterning metal oxide materials in a semiconductor structure. The method comprises a first step of depositing a layer of metal oxide material over a substrate. Then, a patterned mask layer is formed over the metal oxide layer leaving one or more first regions of the metal oxide layer exposed. The exposed first regions of the metal oxide layer are then subjected to an ion bombardment process to thereby damage the first regions of the metal oxide layer. The exposed and damaged first regions of the metal oxide layer are then removed by a chemical etch. Advantageously, the system and method is implemented to provide high-k dielectric materials in small-scale semiconductor devices. The ion bombardment processes used to effect damage-induced wet etching in metal oxide films include low energy ion bombardment, such as that provided by a plasma treatment, and ion implantation (I/I) techniques such as those conventionally used in the semiconductor industry for semiconductor doping. Advancement over the prior art is in the new application of the "I/I damage plus wet etch" technique to metal oxides (including metal oxides not previously etchable by wet methods), as well as in the extension of I/I damage methods to include lower energy, plasma-based ion bombardment. Plasma-based ion bombardment typically uses simpler and cheaper tooling, and results in less collateral damage to underlying structures (since the damage profile can be more easily localized to the depth of the thin metal oxide film).

Advantageously, the system and methods of the present invention may be used to pattern metal oxide hard mask layers which may or may not remain in the final semiconductor device/structure.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

Figure 1A:
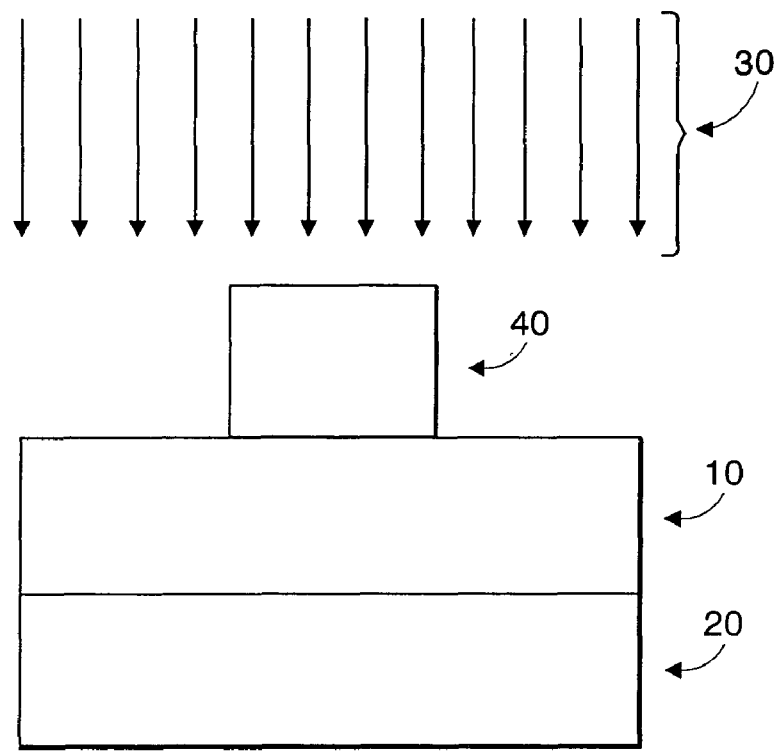
FIGS. 1A-1D illustrate the steps of the basic method of the invention.
Figure 1B:
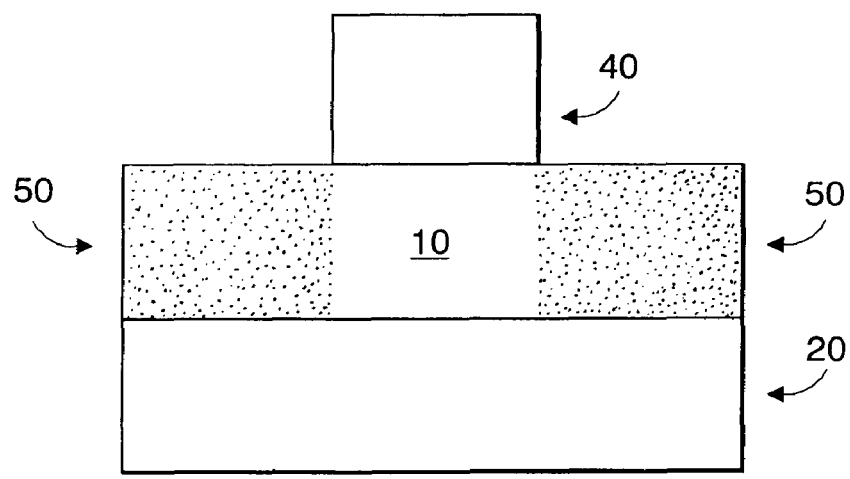
Figure 1C:
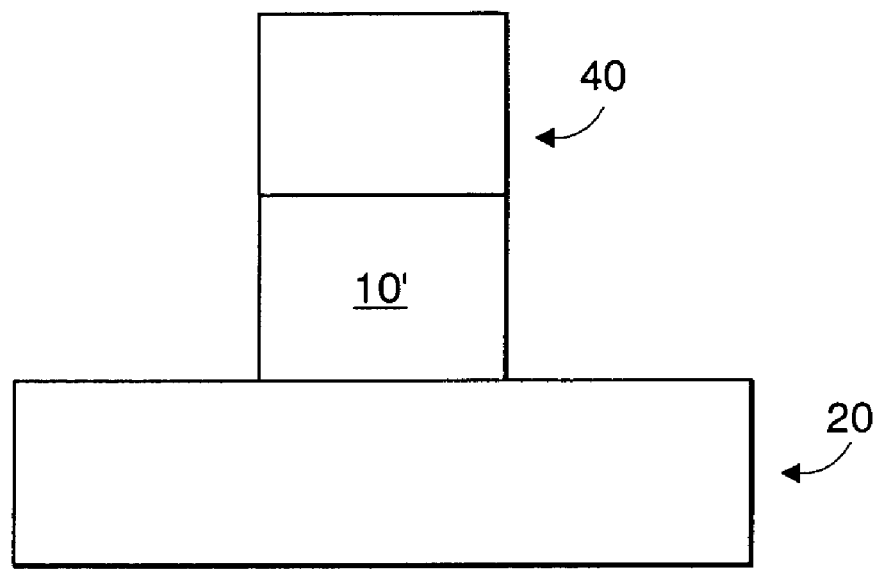
Figure 1D:
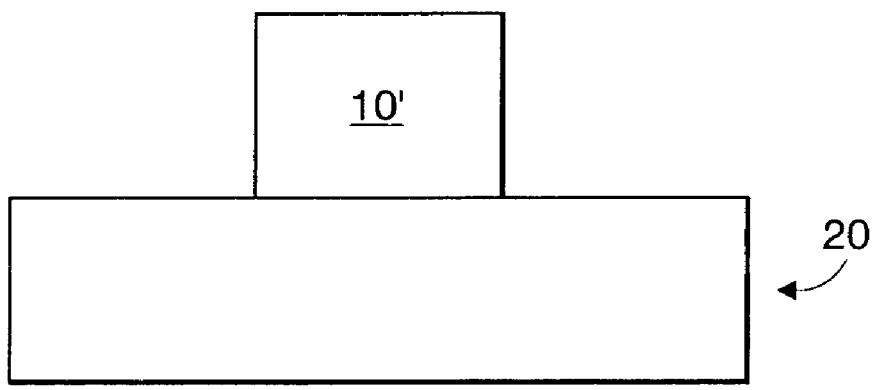

FIGS. 1A-1D illustrate the basic steps of the inventive method. In FIG. 1A, a metal oxide layer 10 on a semiconductor substrate 20 is exposed to ion (or other energetic particle) bombardment 30 through patterned mask 40 to create damaged metal oxide regions 50, as shown in FIG. 1B. Damaged metal oxide regions 50 are then removed by a selective wet etch to produce the structure of FIG. 1C with patterned metal oxide 10'. If desired, patterned mask 40 may be removed before or after removal of damaged metal oxide regions 50 to produce the structure of FIG. 1D.

It should be noted that the step of forming patterned mask layer 40 may be omitted from the steps of FIGS. 1A-1D if blanket ion (or other energetic particle) bombardment 30 is replaced by a maskless direct write bombardment process which applies the bombardment to selected film regions only. It should also be noted that the step of forming patterned mask layer 40 may be omitted altogether if a blanket metal oxide layer is to be etched. Alternatively, the step of forming patterned mask layer 40 may be performed after blanket damage to the metal oxide layer, if, for example, the damage process produces a desirable effect on the metal oxide that is to remain.

Figure 2A:
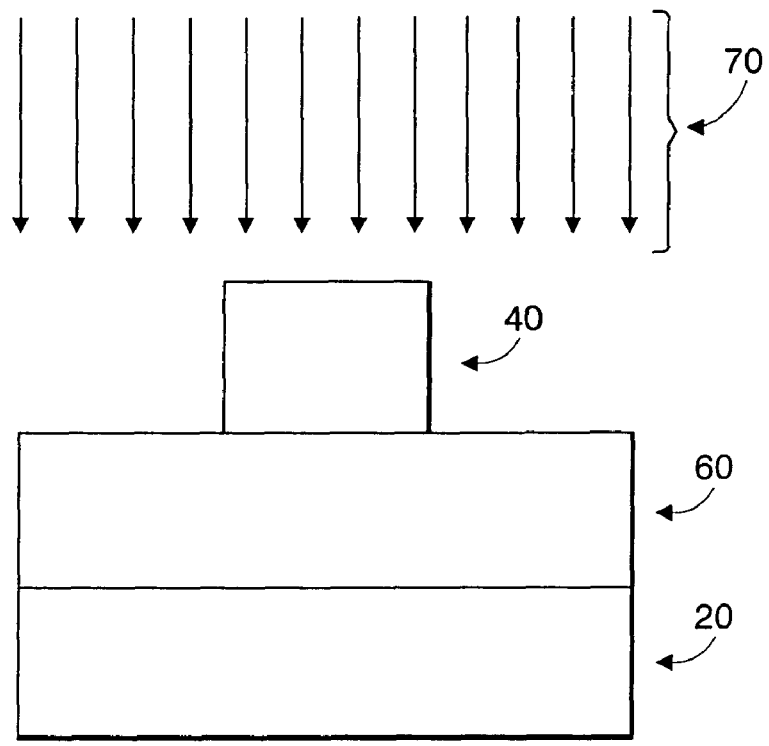
FIGS. 2A-2E illustrate the steps of a variation of the basic method of the invention.
Figure 2B:
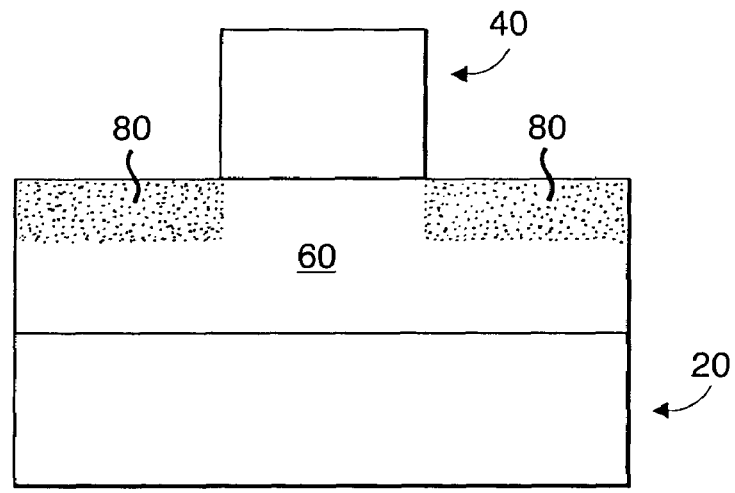
Figure 2C:
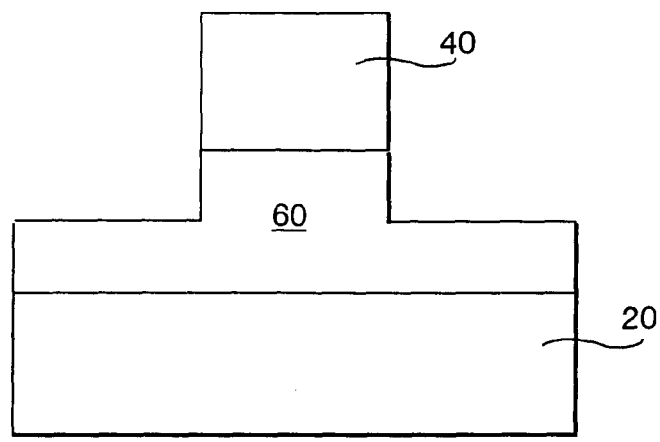
Figure 2D:
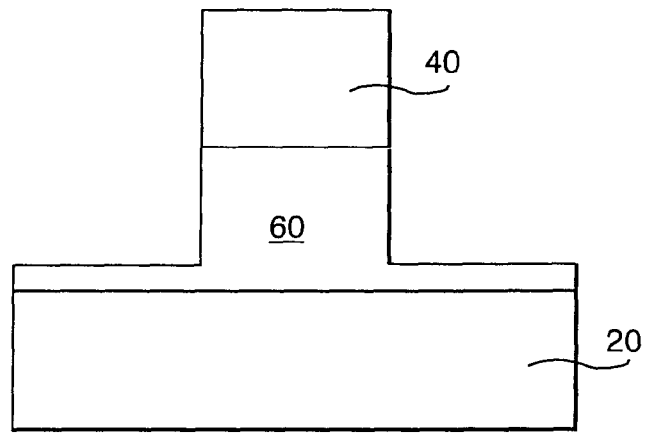
Figure 2E:
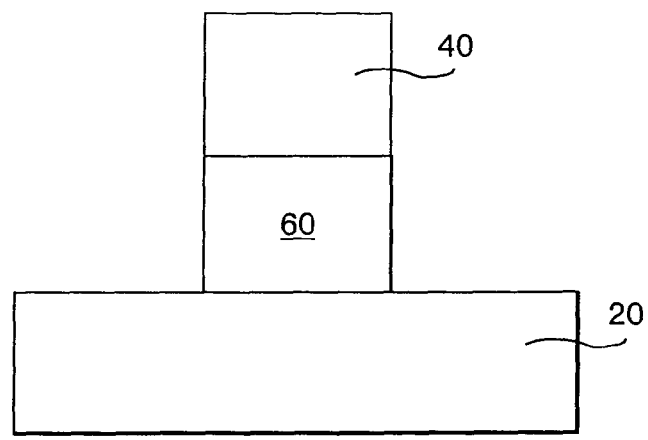

FIGS. 2A-2E illustrate a variation of method FIGS. 1A-1D. This variation can be used when the depth of the damaged region is thin compared to the thickness of the metal oxide layer being etched. In FIG. 2A, thick metal oxide layer 60 on substrate 20 is exposed to ion (or other energetic particle) bombardment 70 through patterned mask 40. Damaged metal oxide regions 80 shown in FIG. 2B are removed by a selective wet etch to produce the structure of FIG. 2C. The bombardment/wet etch cycle of FIGS. 2A-2C can be repeated until the desired thinning is achieved, as shown in FIG. 2D. Alternatively, the bombardment/etch cycles can be repeated until entire thickness of the film is etched, as shown in FIG. 2E. Following these steps, patterned mask 40 may be optionally removed.

If desired, patterns of different etch depths may be formed in the same metal oxide film by using different bombardment conditions (or different numbers of bombardment cycles) for different regions of the film. This might be useful, for example, in making a two-tone phase shift mask for optical lithography applications.

Figure 3A:
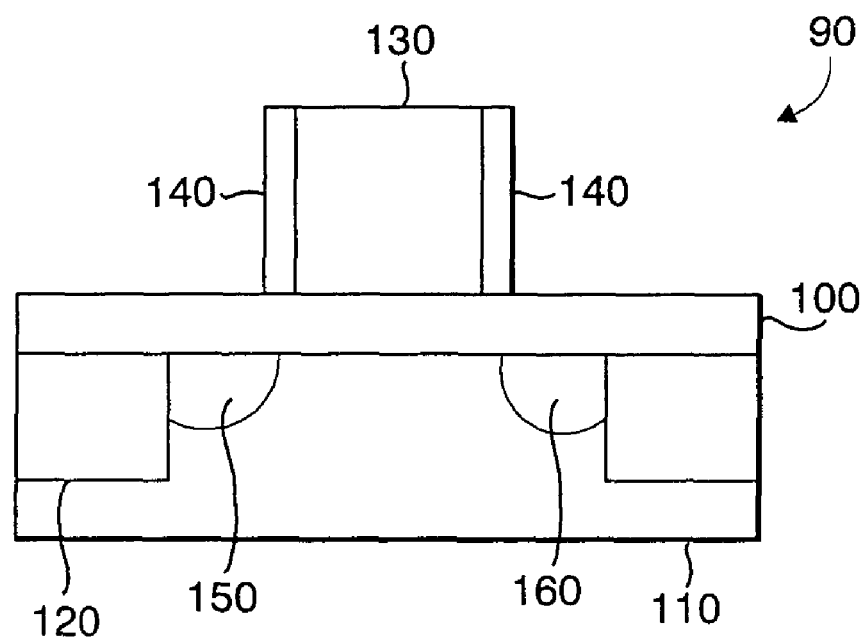
FIGS. 3A-3B illustrate the method of the present invention applied to patterning a thin metal oxide gate dielectric layer in a field effect transistor.
Figure 3B:
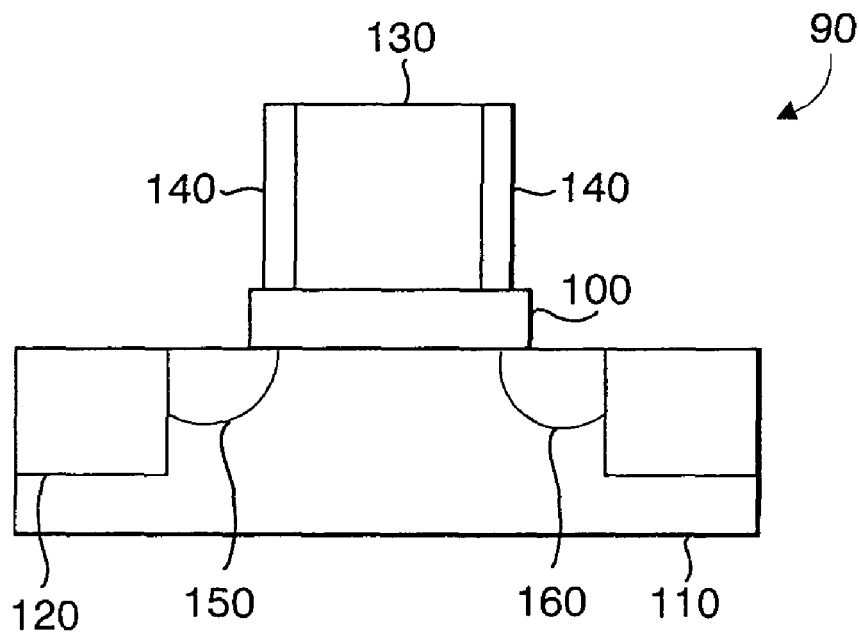

FIGS. 3 and 4 show of two examples of electrical devices in which the methods of this invention may be used to pattern a metal oxide layer. FIGS. 3A-3B show FET 90 before (FIG. 3A) and after (FIG. 3B) patterning of metal oxide gate dielectric layer 100. FET 90 comprises substrate 110, shallow trench isolation regions 120, source 150, drain 160, conductive gate 130, and optional sidewall spacers 140. Metal oxide gate dielectric layer 100 is patterned according to the steps of FIGS. 1A-1C, where gate 130 functions as patterned mask layer 40, and the ion implantation process used to implant source/drain regions 150/160 may also function as ion (or other energetic particle) bombardment 30.

Figure 4A:
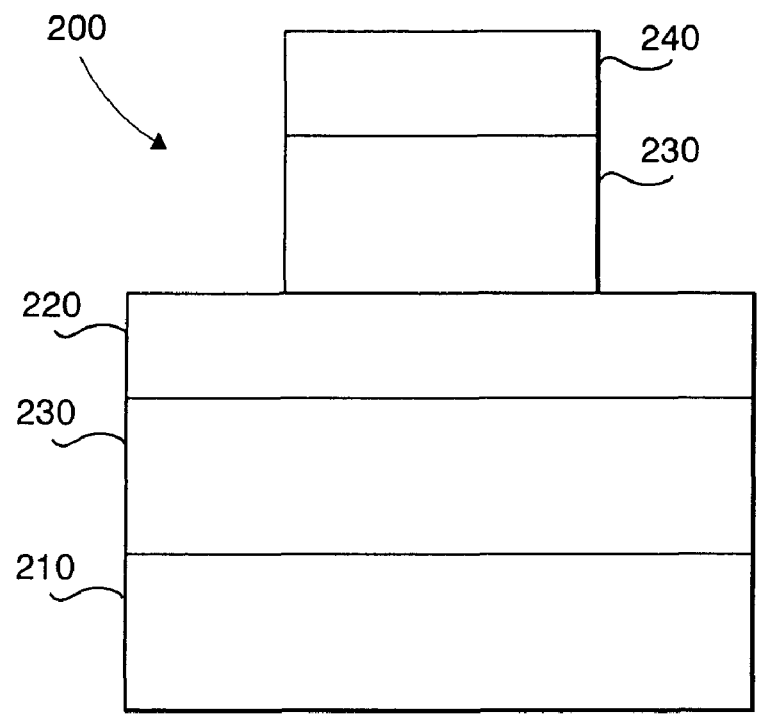
FIGS. 4A-4B illustrate the method of the present invention applied to patterning a thicker metal oxide used as a capacitor dielectric.
Figure 4B:
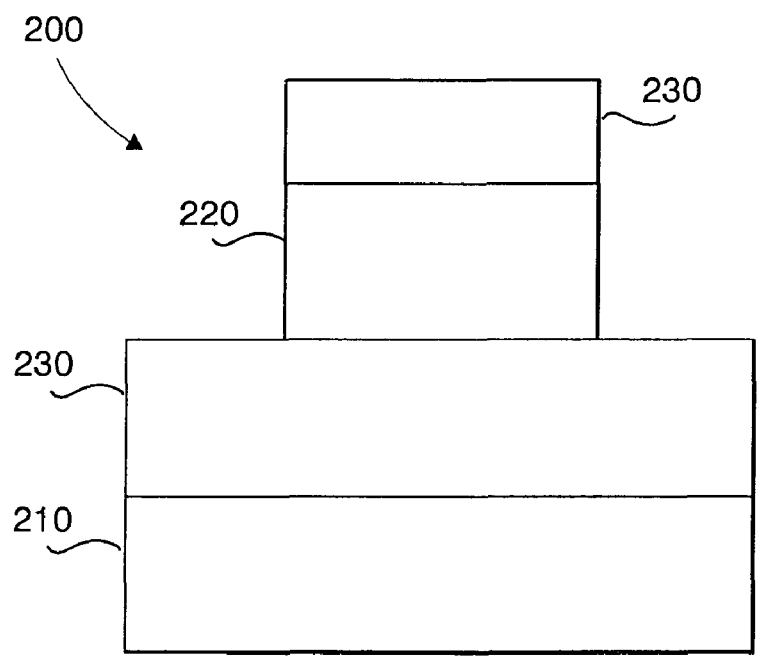

FIGS. 4A-4B show a thin film capacitor 200 on substrate 210 before and after patterning of metal oxide layer 220. Capacitor 200 comprises bottom electrode 230, metal oxide dielectric layer 220, top electrode 230, and optional additional mask layer 240. Metal oxide gate dielectric layer 220 is patterned according to the steps of FIGS. 1A-1C, where patterned mask layer 40 is replaced by top electrode 230 and optional additional mask layer 240.

The ion (or other energetic particle) bombardment of the inventive method may be applied by processes such as ion implantation, plasma treatment, and/or electron beam irradiation. This bombardment does not etch the metal oxide, but rather introduces damage which makes the material susceptible to etching by conventional wet etch solutions. The ion-induced damage may result from any of the following mechanisms: amorphization, other structural changes, insertion of new atoms in the lattice, creation of vacancies, bond breaking/rearrangement, etc. Is should be noted that the bombarding ions from ion implantation processes do not necessarily embed themselves in the metal oxide layer; the damage from ion implantation can also be effected by ions passing through the metal oxide film into the layer below. It should also be noted that the ion (or other energetic particle) bombardment used to make the metal oxide film susceptible to wet etching may also improve the properties of the metal oxide film. For example, exposure to nitrogen-containing plasma or low energy nitrogen ion implantation may damage the film but also provide a beneficial nitridation.

It should also be noted that the damage induced by ion bombardment can often be reversed by annealing. In these cases, "rework" is possible if the damage was inadvertently applied to the wrong regions of the metal oxide film. Thus, the metal oxide may be subsequently annealed to "erase" the damage (prior to ion bombardment re-expose). Annealing may also be desirable after the damaged metal oxide regions have been wet etched, to repair substrate damage.

In the preferred embodiment, bombardment conditions are tailored to the thickness and quality of the metal oxide layer, and on the sensitivity of the mask and substrate to collateral damage from the bombardment. Ion implantation species may be selected from any of the elements or molecular ions (e.g., Si, Ge, B, P, Sb, As, O, N, Ar, BF3, etc.). Implantation energies may range from 1 to 100 keV, with a preferred range of 2 keV to 10 keV for films less than 5 nm thick. Implantation doses may range from $1 \times 10^{14}/cm^2$ to $1 \times 10^6/cm^2$, with a preferred range of $5 \times 10^{14}/cm^2$ to $2 \times 10^{15}/cm^2$ for films less than 5 nm thick. Thicker films require higher energies than the 5 keV-10 keV cited as preferable if multiple bombardment/etch cycles are to be avoided.

Plasma treatments may be performed in a conventional RIE tool, high density plasma tool, etc., with or without an additional bias voltage applied to the substrate. It should be understood that plasma ashers and conventional plasma etching tools may also be used if the tool geometry and plasma parameters (power, working gas pressure, etc.) allow a sufficient self-bias to develop. Ion bombardment may also be performed by ion beam irradiation. Ion or plasma species may be formed by rf, dc, microwave, etc., excitation of working gases including but not limited to: the noble gases, such as He, Ne, Ar, Kr, Xe; diatomic gases such as $O_2$, $N_2$, $H_2$, $F_2$, $Cl_2$, $Br_2$; triatomic gases such as $CO_2$, $N_2O$, $H_2O$; halogen containing gases such as $CF_4$, $C_xF_y$, $C_xCl_y$, $C_xF_yCl_z$; hydrogen-containing gases such as $C_xH_y$, $C_xH_yX_z$ and HX where X=halogen, $C_xH_ySi_z$, where x, y and z are integers ranging from 1 through 10, and, mixtures including any one of these gases. Preferred working gases include $O_2$ and Ar, since plasma species from these gases do not chemically etch Si (the typical substrate). As would be within the purview of skilled artisans, preferred ion energies and doses depend on the thickness and quality of the metal oxide layer, and on the sensitivity of the mask and substrate to collateral damage from the bombardment. For example, ion energies of plasma species are typically between 50 eV and 1 keV, and ion energies of ion beam species are typically between 0.5 keV and 3 keV. Plasma treatments would thus be preferred when the desired ion energy is lower than values that can be reliably and efficiently provided by ion implantation tools.

Wet etch solutions to remove the damaged metal oxide regions may be selected from the group of chemistries including aqueous HF, aqueous buffered HF, and solutions containing at least one of the following components: inorganic bases such as sodium hydroxide, potassium hydroxide, and ammonium hydroxide; organic bases such as tetramethyl ammonium hydroxide (TMAH) and choline (2-hydroxyethyltrimethylammonium hydroxide); hydrogen peroxide; organic acids such as acetic acid; HF, sulfuric acid, nitric acid, other mineral acids; ammonium fluoride, other buffering salts; etc.

It should be noted that the metal oxides to which the system and methods of this invention pertain include not only the pure metal oxides M-O, but also materials comprising at least 95 wt.-% of the following materials or mixtures thereof: metal oxides M-O, metal silicates M-Si—O, metal aluminates M-Al—O, metal oxynitrides M-O—N, metal oxysiliconnitrides M-Si—N—O, and metal oxyaluminitrides M-Al—N—O, where the metal M is selected from the group including Al, Sb, As, Ba, Bi, Ca, Cd, Ce, Cs, Cr, Co, Cu, Dy, Er, Eu, Gd, Ga, Hf, In, Ir, K, La, Pb, Pd, Pr, Pt, Li, Mg, Mn, Hg, Mo, Na, Nd, Ni, Rb, Sc, Se, Sm, Ta, Te, Th, Ti, Tl, Tm, Sn, W, V, Yb, Y, Zn, and Zr, mixtures of metals in this group; and, alloys of metals in this group. Preferable materials include: $HfO_2$, $ZrO_2$, $La_2O_3$, $Al_2O_3$, $Y_2O_3$, and oxynitrides and silicates thereof.

Figure 5:
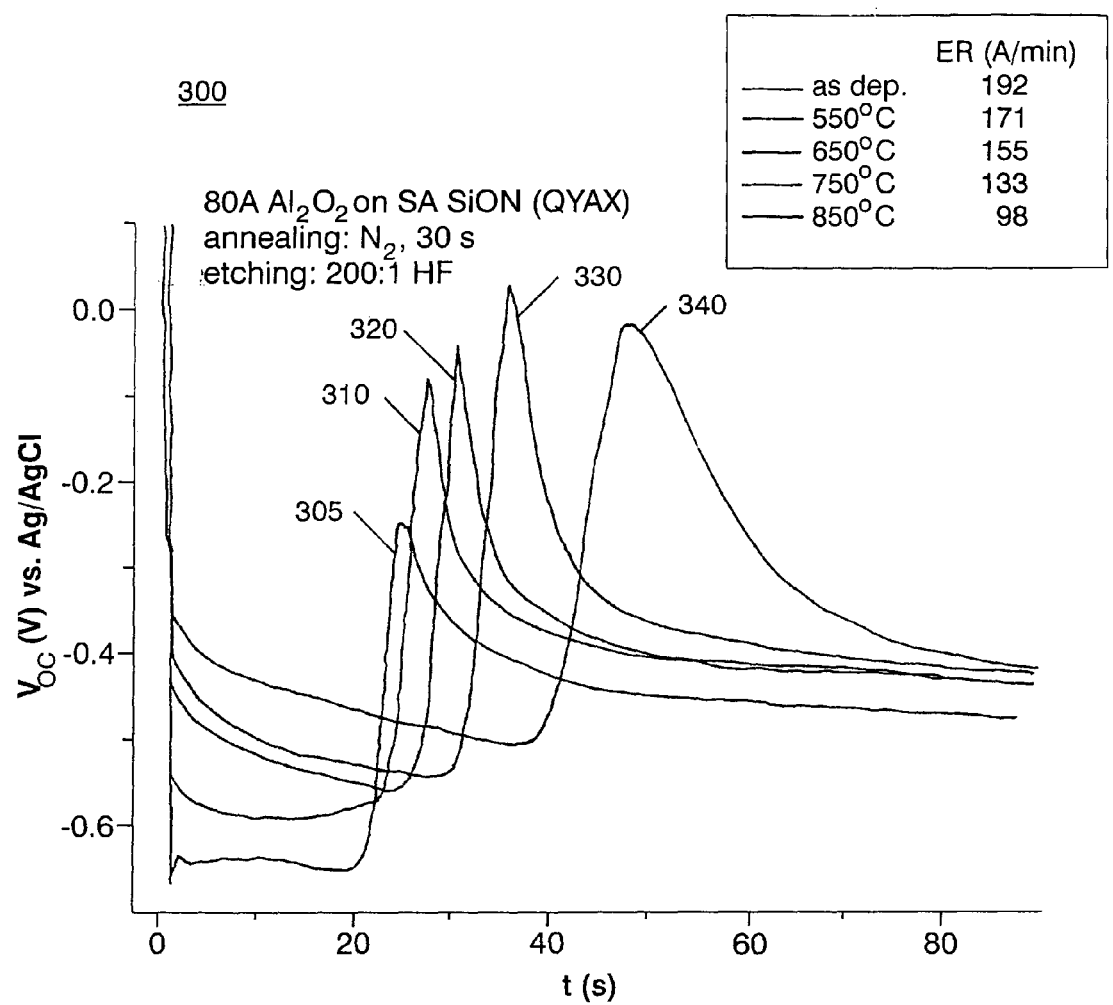
FIGS. 5-7 illustrate how annealed metal oxide films are modified by ion implantation in conventional semiconductor materials as demonstrated by results of electrochemical open circuit potential (OCP) measurements.
Figure 6:
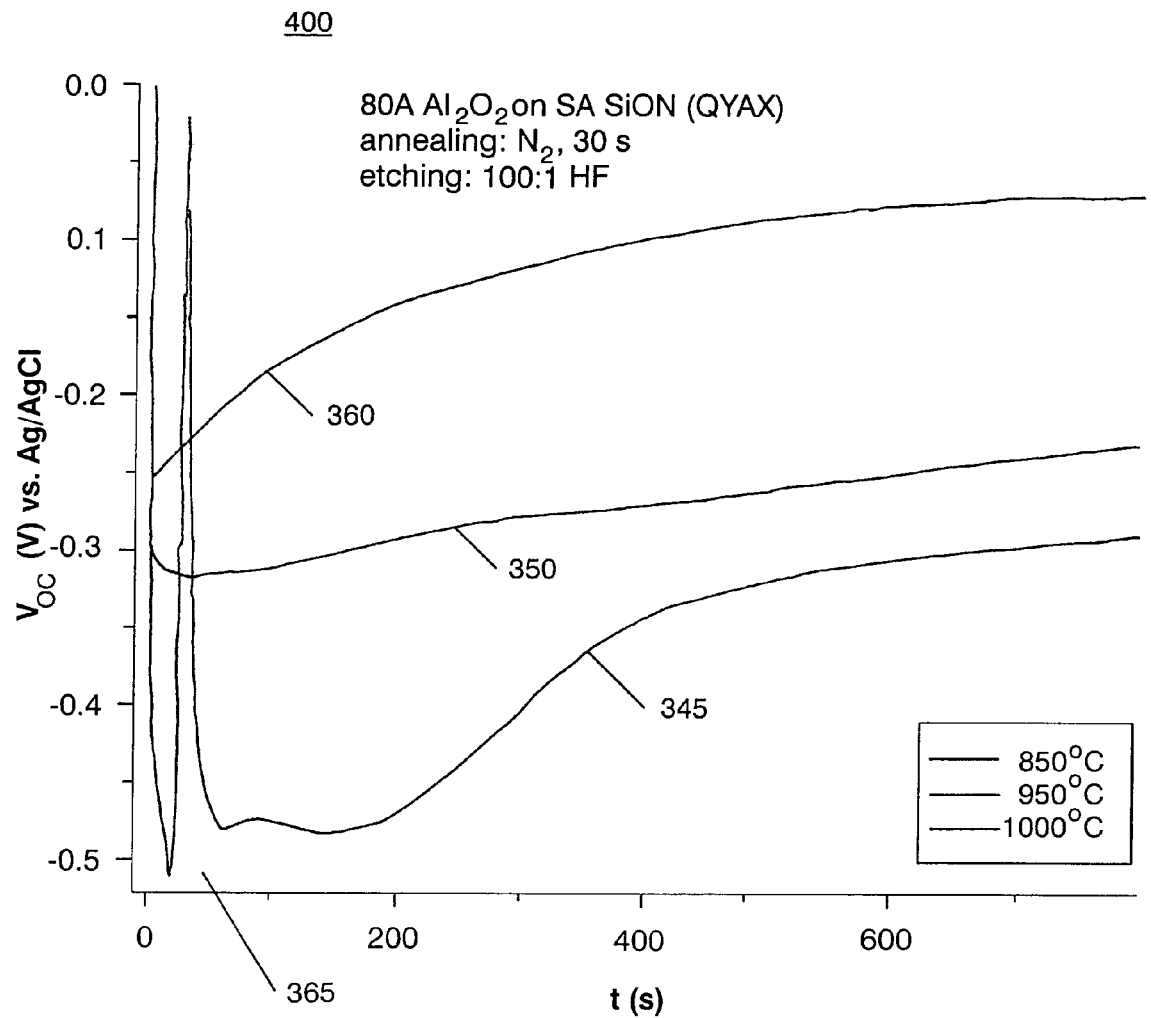
Figure 7:
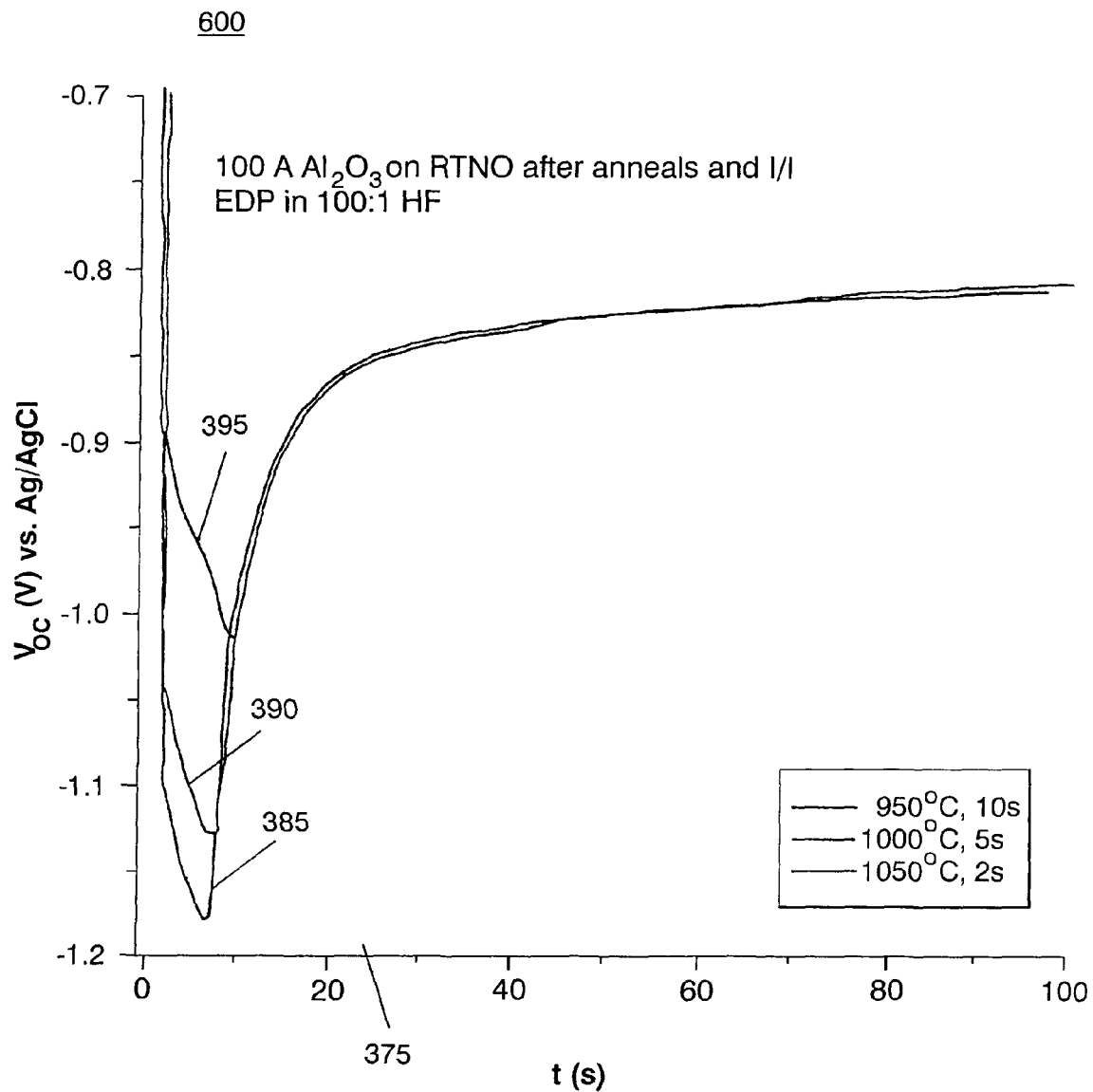

FIGS. 5-7 provide data on the etching of metal oxide films subjected to various annealing and ion implantation treatments. Measurements are results of Electrochemical Depth Profiling-Open Circuit Potential (EDP-OCP) measurements performed in the manner such as described in the reference to H. F. Okorn-Schmidt et al., in "The Physics and Chemistry of $SiO_2$ and the Si—$SiO_2$ Interface—4, H. Z. Massoud et al., Edt., Proc. Vol. 2000-2, The Electrochemical Society, Pennington, N.J., 2000, or, the reference H. F. Okorn-Schmidt, IBM J. Research Develop. 43 351 (1999), the whole contents and disclosure of each of which is incorporated by reference as if fully set forth herein. In the plots of FIGS. 5-7, the Y-axis represents the open circuit potential, Voc (measured in volts) with respect to a standard Ag/AgCl electrode according to the OCP technique versus time in seconds, t(s), on the X-axis.

The following examples reveal the details of the invention for the exemplary cases of: (1) a $Al_2O_3$ metal oxide 8 nm-10 nm thick, bombardment by ion implantation, and wet etching in 100:1 HF; and, (2) a $HfO_2$ metal oxide 2 nm-5 nm thick, bombarded by an $O_2$ RIE plasma, with wet etching in 10:1 HF or 50:1 buffered oxide etch (an aqueous mixture of HF and $NH_4F$).

EXAMPLE 1

In an example embodiment, 8 to 10 nm-thick films of $Al_2O_3$ were deposited on Si wafers coated with an 0.8 nm-thick layer of thermally grown nitrided $SiO_2$ (denoted as $SiO_xN_y$ or SiON). After being subjected to anneals in $N_2$ at different temperatures, the $Al_2O_3$ was tested for the ability to be etched in aqueous HF solutions by OCP. FIG. 5 is a plot 300 of OCP data obtained for 8 nm-thick $Al_2O_3$ films in 200:1 dilute HF (about 0.25 wt.-% HF). OCP trace 305 is for an unannealed film, and traces 310, 320, 330, and 340 are for films annealed at temperatures of 550° C., 650° C., 750° C., and 850° C., respectively. The peaks in traces 305 to 340 indicate the time at which the $Al_2O_3/SiO_xN_y$ interface is reached, i.e., the time to etch through the $Al_2O_3$. These $Al_2O_3/SiO_xN_y$ interface peaks move to longer etch times as the anneal temperature increases, indicating that the $Al_2O_3$ becomes harder to etch. Etch rates are determined from the initial film thickness and the time it takes for the interface peak to appear. For example, the as-deposited $Al_2O_3$ film has an etch rate of 92 A/min (8 nm/25 sec) and the film annealed at 850° C. has an etch rate of 98 A/min (8 nm/49 sec).

The plot 400 illustrated in FIG. 6 shows the effect of higher anneal temperatures on the etchability of $Al_2O_3$ films in 100:1 dilute HF (about 0.5 wt-% HF). OCP traces 345, 350 and 360 are for films annealed at temperatures of 850° C., 950° C. and 1000° C., respectively. Trace 345 for the film annealed at 850° C. shows that the $Al_2O_3/SiO_xN_y$ interface is reached after about 30 sec, indicated as time 365. However films annealed at 950° C. and 1000° C. become very hard to etch, as indicated by the absence of the characteristic interface peak even after 700 sec of etching, as well as by the lack of an abrupt flattening of the potential to a flat, stable value after a reasonable amount of time. The presence of residual $Al_2O_3$ was also indicated by the fact that the sample surface did not become hydrophobic (i.e., show dewetting behavior).

The plot 600 illustrated in FIG. 7 shows that 10 nm-thick $Al_2O_3$ films annealed at 950-1050° C. become etchable in 100:1 dilute HF after exposure to an ion implant treatment. OCP traces 385, 390, and 395 are for films annealed at temperatures of 950° C., 1000° C. and 1050° C., respectively. All three traces show clear endpoints for $Al_2O_3+SiO_xN_y$ removal, indicated as time 375, at which point the potential levels off to a relatively flat and stable value. The complete removal of $Al_2O_3$ was also indicated by the hydrophobic sample surface, as well as by x-ray photoelectron spectroscopy (XPS), low-energy electron microscopy (LEEM), and atomic force microscopy (AFM) measurements which showed no surface aluminum. The absence of the $Al_2O_3/SiO_xN_y$ interface peak seen in the FIG. 5 OCP data is attributed to ion-induced damage and/or mixing effects.

EXAMPLE 2

In a second example, 2 nm-5 nm thick $HfO_2$ films deposited by atomic layer chemical vapor deposition (ALCVD) on Si substrates are subsequently annealed in $N_2$ at 700° C. for 30 sec. Etch times (as indicated by time to "dewet" or become hydrophobic) were examined as a function of $HfO_2$ film thickness, the power and time of oxygen plasma treatments, post-oxygen-plasma anneals, and wet etch chemistry.

Table I compares the dewet times of oxygen-plasma-treated $HfO_2$ films in 50:1 buffered HF ("buffered oxide etch" or BOE) and 10:1 aqueous HF. The $HfO_2$ films were 2.9 nm thick in the example. The plasma treatments were performed in a Plasmalab µP-RIE 80 system with 24-cm-diam water-cooled electrode driven by a 13.56 MHz power supply, with the samples placed on a Si susceptor plate separated from the cathode by a second susceptor plate of graphite. The $O_2$ pressure was 20 mTorr, the flow was 20 sccm (standard cubic centimeters per minute), and the treatment duration was 1 minute. Three powers were compared: 0 W (control sample), 150 W (with a self-bias voltage of −280 Vdc), and 300 W (with a self-bias voltage of −390 Vdc).

TABLE I

Dewet times of 2.9 nm thick $HfO_2$ films after various $O_2$ plasma treatments.

| Etchant/$O_2$ Power (W) | 0 | 150 | 300 |
|---|---|---|---|
| BOE 50:1 | >21 min | 20-25 sec | 20-25 sec |
| HF 10:1 | >10 min | 4 sec | 4 sec |

It is clear that the plasma treatments are very effective in transforming the $HfO_2$ into an etchable material, and that etching is fast in both BOE and HF. BOE, unlike aqueous HF, is compatible with many photoresists and for this reason may be preferred over aqueous HF as the wet etchant.

Table II provides data demonstrating how dewet times for a given plasma exposure vary with $HfO_2$ film thickness. The data indicates that the damage provided by 150 W treatment is extremely shallow; it is enough to damage 2.9 nm of $HfO_2$, but not the entire thickness of 4.6 nm $HfO_2$ film. It was also found that an 8.7 nm thick layer of $SiO_2$ layer prevented damage to a 2.2 nm thick $HfO_2$ underlayer from a 5 min 150 W $O_2$ plasma treatment, again indicating that plasma damage is extremely shallow. These results suggest that low energy plasma ions may be preferred over the higher energy implanted ions in the case of damage-sensitive substrates.

TABLE II

Effect of $HfO_2$ thickness on dewet times in 10:1 aqueous HF after $O_2$ plasma treatments of 1 min duration.

| $HfO_2$ thickness/$O_2$ Power (W) | 0 | 150 | 300 |
|---|---|---|---|
| 2.9 nm | >10 min | 4 sec | 4 sec |
| 4.6 nm | >10 min | >11.5 min | 45 sec-4.25 min |

Table III provides data demonstrating how damage induced in 2.9 nm thick $HfO_2$ films by $O_2$ plasma treatments may be at least partially annealed out by various thermal treatments in a rapid thermal annealer. Annealing increases the dewet times, and higher power plasma treatments generate more damage, as indicated by the shorter dewet times for a given annealing condition.

TABLE III

Effect of post-plasma-treatment anneals on dewet times of 2.9 nm-thick $HfO_2$ films in aqueous 10:1 HF.

| Anneal/$O_2$ Power (W) | 150 | 300 |
|---|---|---|
| No anneal | 4 sec | 4 sec |
| 400° C./5 min $N_2$ | 15-20 sec | 5 sec |
| 700° C./1 min $N_2$ | 4-11.5 min | 10-15 sec |

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A method for patterning a metal oxide dielectric material in a semiconductor structure comprising:

a) forming a patterned mask layer over a metal oxide dielectric layer provided on a semiconductor structure leaving one or more first regions of said metal oxide dielectric layer exposed, wherein the metal oxide dielectric layer has a thickness of less than 10 nm;

b) subjecting said exposed one or more first regions of said metal oxide dielectric layer to a plasma treatment process including a plasma species generated by an etching tool and excitation of a working gas to thereby damage a lattice structure of said one or more first regions of said metal oxide dielectric layer by implantation of the plasma species through the metal oxide dielectric layer into the semiconductor structure, wherein the implantation comprises an implantation energy ranging from 1 keV to 10 keV; and c) removing said exposed and damaged one or more first regions of said metal oxide dielectric layer by a wet chemical etch, wherein said dielectric metal oxide dielectric layer includes a material selected from the group consisting of: metal oxides M-O, metal silicates M-Si—O, metal aluminates M-Al—O, metal oxynitrides M-O—N, metal oxysiliconnitrides M-Si—N—O, and metal oxyaluminitrides M-Al-N—O, where the metal M is selected from the group consisting of Al, Dy, Er, Eu, Gd, Hf, La, Pr, Sc, Sm, Ta, Te, Th, Ti, Tl, Tm, Y, Zr, and alloys of the metals in this group.

2. The method of claim 1, wherein said working gas includes at least one gas, said gas comprising: noble gases including He, Ne, Ar, Kr, Xe, diatomic gases including $O_2$, $N_2$, $H_2$, $F_2$, $Cl_2$, $Br_2$, triatomic gases including $CO_2$, $N_2O$, $H_2O$, halogen containing gases including $CF_4$, $C_xF_y$, $C_xCl_y$, $C_xF_yCl_z$, and hydrogen-containing gases including $C_xH_y$, $C_xH_yX_z$ and HX where X=halogen, $C_xH_ySi_z$, where x,y and z are integers ranging from 1 through 10, and, mixtures including any one of these gases.

3. The method of claim 1, wherein said working gas comprises $O_2$, Ar, either singly or in combination.

4. The method of claim 1, wherein said step of removing said one or more first regions of said metal oxide dielectric layer by a chemical etch comprises the step of: immersing said metal oxide layer in a wet solution having a chemistry, said chemistry comprising: aqueous HF, aqueous buffered HF, and solutions containing at least one of the following components: inorganic bases such as sodium hydroxide, potassium hydroxide, and ammonium hydroxide; organic bases such as tetramethyl ammonium hydroxide (TMAH) and choline (2-hydroxyethyltrimethylammonium hydroxide); hydrogen peroxide; organic acids such as acetic acid; HF, sulfuric acid, nitric acid, other mineral acids; ammonium fluoride, and other buffering salts.

5. The method of claim 1 wherein said metal oxide dielectric layer includes $HfO_2$.

6. The method of claim 1, wherein said metal oxide dielectric layer includes $ZrO_2$.

7. The method of claim 1, wherein said metal oxide dielectric layer includes $La_2O_3$, $Al_2O_3$, $Y_2O_3$ or mixtures thereof.

8. The method of claim 1, wherein said metal oxide dielectric layer includes hafnium silicate (Hf-O—Si), zirconium silicate (Zr-O—Si), or mixtures thereof.

9. The method of claim 1, wherein said metal oxide dielectric layer is subjected to a high temperature anneal treatment prior to the step b) of subjecting said exposed one or more first regions of said metal oxide dielectric layer to said plasma treatment process.

10. The method of claim 1, wherein said step of forming a patterned mask layer is performed after said step of subjecting the metal oxide dielectric layer to said plasma treatment process.

11. The method of claim 10, wherein said plasma treatment process comprises exposure to a nitrogen-containing plasma, which results in nitridation at said first regions of said metal oxide dielectric layer.

12. The method of claim 1, further including the step of removing said patterned mask layer before a final chemical wet etch step.

13. The method of claim 1, further including the step of removing said patterned mask layer after a final chemical wet etch step.

14. The method of claim 1, further including repeating steps c) and d) to ensure that a desired thickness of metal oxide dielectric layer has been removed.

15. A method for integrating a dielectric material into a semiconductor device structure comprising:
   a) providing a semiconductor structure having a layer of high-k dielectric material formed thereon, wherein the high-k dielectric material has a thickness of less than 10 nm;
   b) forming a patterned mask over said layer of high-k dielectric material leaving a region of said layer of high-k dielectric material exposed;
   c) subjecting said exposed region of said layer of high-k dielectric material layer to a plasma treatment process including a plasma species generated by an etching tool and excitation of a working gas to thereby damage a lattice structure of said exposed region of said high-k dielectric material layer by implantation of the plasma species through the high-k dielectric material layer into the semiconductor structure at an implantation energy ranging from 1 keV to 10 keV through the layer of high-k dielectric material into the semiconductor structure, and
   d) chemically etching said exposed and damaged regions of said layer of high-k dielectric material, wherein said layer of high-k dielectric material comprises a metal oxide including a material selected from the group consisting of: metal oxides M-O, metal silicates M-Si—O, metal aluminates M-Al—O, metal oxynitrides M-O—N, metal oxysiliconnitrides M-Si—N—O, and metal oxyaluminitrides M-Al-N—O, where the metal M is selected from the group consisting of Al, Dy, Er, Eu, Gd, Hf, La, Pr, Sc, Sm, Ta, Te, Th, Ti, Tl, Tm, Y, Zr, and alloys of the metals in this group.

16. The method of claim 1, wherein:
said step a) includes a prior step of forming a layer of metal oxide material over said semiconductor structure; and
the metal M is selected from the group consisting of Al, Dy, Er, Eu, Gd, Hf, Pr, Sc, Sm, Te, Th, Tl, Tm, Y, and alloys of the metals in this group.

17. The method of claim 15, wherein:
said step a) includes a prior step of forming a layer of high-k dielectric material over said semiconductor structure; and
the metal M is selected from the group consisting of Al, Dy, Er, Eu, Gd, Hf, Pr, Sc, Sm, Te, Th, Tl, Tm, Y, and alloys of the metals in this group.

18. The method of claim 1, wherein said subjecting said exposed first regions of said metal oxide dielectric layer to said plasma treatment process further comprises one of ion implantation and electron beam irradiation.

19. The method of claim 15, wherein said subjecting said exposed region of said layer of high-k dielectric material to said plasma treatment process further comprises one of ion implantation and electron beam irradiation.

* * * * *